United States Patent
Soubercaze-Pun et al.

(10) Patent No.: US 10,826,444 B2
(45) Date of Patent: Nov. 3, 2020

(54) METHOD FOR PRODUCING AN AMPLIFICATION STAGE FOR A VARIABLE ENVELOPE SIGNAL

(71) Applicant: CENTRE NATIONAL D'ETUDES SPATIALES C N E S, Paris (FR)

(72) Inventors: Geoffroy Soubercaze-Pun, Ramonville-Saint-Agne (FR); Luc Lapierre, Toulouse (FR)

(73) Assignee: CENTRE NATIONAL D'ÉTUDES SPATIALES C N E S, Paris (FR)

( * ) Notice: Subject to any disclaimer, the term of this patent is extended or adjusted under 35 U.S.C. 154(b) by 0 days.

(21) Appl. No.: 15/773,051

(22) PCT Filed: Nov. 3, 2016

(86) PCT No.: PCT/EP2016/076552
§ 371 (c)(1),
(2) Date: May 2, 2018

(87) PCT Pub. No.: WO2017/076969
PCT Pub. Date: May 11, 2017

(65) Prior Publication Data
US 2018/0316320 A1    Nov. 1, 2018

(30) Foreign Application Priority Data
Nov. 4, 2015  (FR) ...................... 15 60585

(51) Int. Cl.
*H03F 1/56* (2006.01)
*H03F 1/02* (2006.01)
(Continued)

(52) U.S. Cl.
CPC ............. *H03F 1/56* (2013.01); *H03F 1/0211* (2013.01); *H03F 1/0277* (2013.01); *H03F 1/06* (2013.01);
(Continued)

(58) Field of Classification Search
USPC ........................ 330/285, 296, 291, 136, 149
See application file for complete search history.

(56) References Cited

U.S. PATENT DOCUMENTS

| | | | |
|---|---|---|---|
| 6,141,541 A | 10/2000 | Midya et al. | |
| 8,185,066 B2 * | 5/2012 | Camp, Jr. ............. | H03F 1/0222 330/149 |

(Continued)

FOREIGN PATENT DOCUMENTS

| | | |
|---|---|---|
| FR | 1453773 | 6/1966 |
| FR | 1 453 773 A | 8/1966 |

OTHER PUBLICATIONS

International Search Report, dated Jan. 24, 2017, from corresponding PCT/EP2016/076552 application.
(Continued)

*Primary Examiner* — Hieu P Nguyen
(74) *Attorney, Agent, or Firm* — Burris Law, PLLC

(57) ABSTRACT

Disclosed is a method for producing a stage for amplifying the power of a variable envelope signal including at least one amplifier. For each amplifier, a form of ideal variation in average power $POUT_L$ is selected. For each value of each setting parameter and for each average input power value, a value of an optimisation criterion is calculated on the basis of the mathematical expectation of at least one optimisation parameter. An optimum value of each setting parameter is determined and the amplification stage is produced with a number of amplifiers in parallel determined on the basis of an average output power value and with, for each amplifier, matching circuits providing the optimum values of the setting parameters. The invention also relates to an amplification stage produced in this manner.

20 Claims, 4 Drawing Sheets

Figure 1:
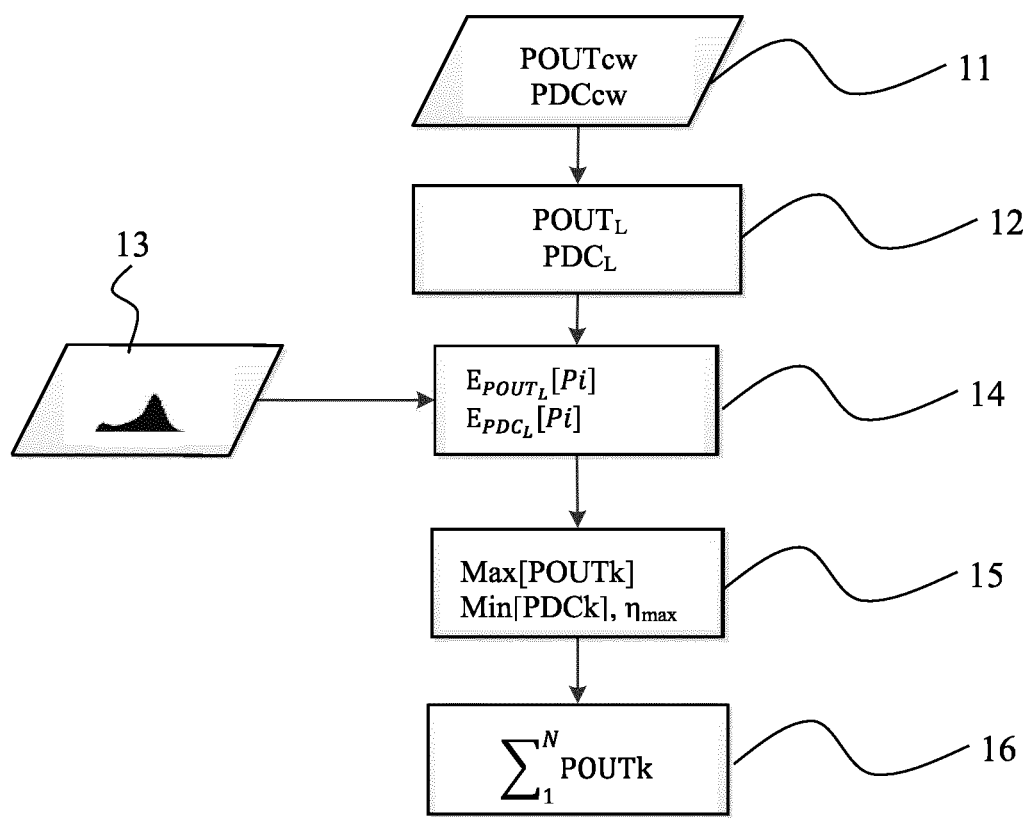

(51) Int. Cl.
  *H03F 3/19* (2006.01)
  *H03F 3/21* (2006.01)
  *H03F 3/189* (2006.01)
  *H03F 1/32* (2006.01)
  *H03F 3/24* (2006.01)
  *H03F 1/06* (2006.01)
  *H03F 3/22* (2006.01)
  *H03F 3/58* (2006.01)

(52) U.S. Cl.
  CPC ........... *H03F 1/3241* (2013.01); *H03F 3/189* (2013.01); *H03F 3/19* (2013.01); *H03F 3/211* (2013.01); *H03F 3/22* (2013.01); *H03F 3/245* (2013.01); *H03F 3/58* (2013.01); *H03F 2200/102* (2013.01); *H03F 2200/462* (2013.01); *H03F 2200/465* (2013.01); *H03F 2200/471* (2013.01); *H03F 2203/21106* (2013.01); *H03F 2203/21142* (2013.01)

(56) References Cited

U.S. PATENT DOCUMENTS

2012/0105150 A1   5/2012   Wimpenny
2015/0236729 A1   8/2015   Peng et al.

OTHER PUBLICATIONS

International Preliminary Report on Patentability, from corresponding PCT application.
International Search Report, dated Jan. 16, 2017, from corresponding PCT application.
Faulkner, Michael and Johansson, Mats, "Adaptive Linearization Using Predistortion—Experimental Results," IEEE Transactions on Vehicular Technology, vol. 42, No. 2, May 1994, pp. 323-332.
Hammi, Oualid et al., "On the Robustness of Digital Predistortion Function Synthesis and Average Power Tracking for Highly Non-linear Power Amplifiers," IEEE Transactions on Microwave Theory and Techniques, vol. 55, No. 6, Jun. 2207, pp. 1382-1389.
De Matos, M. et al., "Caractérisation en puissance aux fréquences millimétriques de circuits nanométriques en technologie silicium," CNFM (CNFM 2008), Nov. 2008, St Malo, France. pp. 111-116.
Nagata, Yoshinori, "Linear Amplification Technique for Digital Mobile Communications," 39th IEEE Vehicular Technology Conference, May 1989, pp. 159-164.
Sombrin, Optimization criteria for power amplifiers, International Journal of Microwave and Wireless Technologies, pp. 1-11, Cambridge University Press and the European Microwave Association, Feb. 2011.

\* cited by examiner

7 APSK

16APSK

16 QAM

METHOD FOR PRODUCING AN AMPLIFICATION STAGE FOR A VARIABLE ENVELOPE SIGNAL

The invention relates to a method for producing a stage for amplifying the power of a variable envelope input signal having a predetermined instantaneous power statistical distribution, this amplification stage providing a predetermined average output power POUT and comprising at least one amplifier and matching circuits determining setting parameters (e.g. selected for solid-state circuits from among biasing voltages, the complex value of the load impedance, . . . ; or for travelling-wave tubes from among beam current, helix voltage, collector voltages, . . . ), the value of which influences average power POUT(PIN), phase PM(PIN), and consumption PDC(PIN) transfer functions of the amplification stage. The invention also relates to an amplification stage produced in this manner.

The problem of non-linearity in power amplifiers has been present for a very long time (tens of years), more particularly in the field of microwave frequencies (300 MHz to 300 GHz), for example for telecommunications and/or television broadcasting (satellite or terrestrial) and/or on-board/ground links with artificial satellites orbiting around the Earth. In fact, in these applications, as in others, optimisation of the power balance and the spectral responsivity leads to the use of high power amplifiers (HPA) in their entire operating range, i.e. up to the saturation point.

Several linearization methods are known to date to overcome this problem, in particular methods named post-distortion methods, methods named equalisation methods with a model circuit following the imperfect amplification stage, and methods of pre-distortion consisting of:

either modelling the imperfect circuit, in particular by an analytical model which can be inversed (e.g. polynomial with or without a memory, Volterra series, . . . ) or digital (tables of coefficients modelling the transfer functions, neuron networks, . . . ) or specific (Hammerstein, Wiener, Hammerstein-Wiener, parallel Wiener, . . . ) and introducing into the input of the imperfect circuit a pre-distortion circuit producing a response in accordance with this inversed model;

or adding in series a parameterizable pre-distortion circuit whose transfer characteristics (in particular in average power and in phase) are empirically adjusted by successive iterations by observing the variations of the output signal on the basis of those of the input signal.

The first linearization methods cannot always be used, e.g. when there is no inverse function of the model which can be applied to the non-linear circuit. Moreover, in the case of amplifiers, the inverse function of the modelling of the power characteristic of the HPA has, on principle, a singularity close to saturation because its slope tends towards infinity. Furthermore, they are most often extremely complex and difficult to implement and/or are dedicated to specific categories of non-linear circuits or to applications which are very specific and/or less precise by nature (i.e. do not produce results of sufficient quality taking into account approximations caused by the modelling). They require computing and energy resources which are extremely cumbersome and are not necessarily available (e.g. on-board a space system). Furthermore, some models can be applied only to travelling-wave tube amplifiers, but not to solid-state circuits.

The second linearization methods result in extremely high optimisation costs and are also imperfect in that it is not certain in advance whether it will be possible to make, by successive iterations, an adjustment of the different characteristics of the parameterizable pre-distortion circuit allowing a suitable response exiting the non-linear circuit to be effectively empirically obtained.

Furthermore, numerous propositions have been made with an aim of optimising some of these linearization methods, e.g. to allow real time dynamic optimisation or matching of the pre-distortion characteristics, in particular with a feedback loop. However, once again, these optimisations are applicable only in the context of very specific circuits and/or applications, and the implementation thereof is complex in practice.

Thus, US 2012/0105150 describes a method for controlling an amplification system in which the biasing voltages and feed voltages are modulated instantaneously on the basis of signals derived from the envelope voltage of the input signal. This circuit requires an envelope detector and a voltage selection stage which generates the feed voltage and the biasing voltage to be applied to the amplification stage. Non-linear mapping elements allow the definition of the values of the feed voltage and biasing voltage on the basis of the envelope of the input signal, e.g. in accordance with a 3rd order polynomial expansion and/or by value tables established by characterisation of the device.

US 2015/0236729 also describes a method and an apparatus allowing the real time dynamic optimisation of an amplification stage by detecting the envelope of the input signal. Again, this circuit necessarily incorporates an envelope tracking (ET) system.

Consequently, the known linearization methods are cumbersome, costly, non-universal, limited to particular circuits or applications, always imperfect on principle and most often not sufficiently precise. Therefore, despite the fact that this linearization problem has been present for a very long time, a simple, economic and universal satisfactory solution which is absolutely efficient by design has not yet been provided.

Regardless of the linearization methods, the problem which thus arises for the production of a stage for amplifying the power of a variable envelope signal, such as a microwave frequency communication signal, consists of optimising the settings of the matching circuits so as to obtain responses which are as linear as possible together with optimum values of optimisation criteria such as the average output power and/or the yield and/or the consumption and/or the dissipated power. These restrictions are in fact antagonistic: good linearity can be guaranteed only in return for a low value of the output power so as to remain below saturation, and optimum use of the circuit up to saturation has a negative effect on the linearity of the amplified signal. There is thus the need to multiply the components necessary for obtaining a sufficient output power, with the detriment being an increase in mass and/or bulkiness and/or cost of the equipment.

For example, in the case of amplifiers formed of transistors (solid-state electronic circuits), this optimisation consists of determining the biasing and load impedance characteristics of each transistor, each of these two parameters having, in general, two variables (gate voltage and drain voltage for a field effect transistor FET; real and imaginary portions of the load impedance). The publication "Optimization criteria for power amplifiers", J. Sombrin, International Journal of Microwave and Wireless Technologies, vol. 3, issue 1, pp. 35-45, 2011, also mentions different criteria which can theoretically be advantageously used for optimization of power amplifiers.

Different solutions with higher or lower complexity have been developed in the past for determining the settings of the matching circuits. In the case of transistors, a traditional technique consists of selecting biasing values and of examining, with the aid of a testbed (referred to as "load pull"), all the impedances of the Smith chart by extracting the characteristics of average power, phase and consumption by using a constant-envelope sinusoidal signal at the desired frequency so as to establish the maximum electrical yield at the saturation power. The performance which can be achieved in terms of power and yield, for a given wanted-to-intermodulation signal ratio in accordance with the application (i.e. as a function of the waveform) is then deduced from the characteristics of the real variable envelope input signal. The non-linearity problems in terms of amplitude, phase and consumption are thus encountered.

The invention aims to overcome these disadvantages by proposing a method allowing the best optimisation of the setting parameters of an amplification stage, and to do so in a quicker, simpler and more systematic manner, which can be applied with various amplifier technologies and various input signals, in particular communication signals, more particularly in the field of microwave frequencies (300 MHz to 300 GHz).

The invention also aims to propose such a method which can be implemented in a simple manner, with conventional installations and devices, and which does not change working practices.

Throughout the text, the term "variable envelope signal" is intended to mean any signal having an amplitude which varies over time at a predetermined frequency corresponding to the minimum frequency of the signal.

The invention thus relates to a method for producing a stage for amplifying the power of a variable envelope input signal having a predetermined instantaneous power statistical distribution, this amplification stage comprising at least one amplifier and matching circuits determining setting parameters, the value of which influences average power POUT(PIN), phase PM(PIN), and consumption PDC(PIN) transfer functions of the amplification stage, characterised in that it comprises the following steps:

for each amplifier, selecting a form of ideal variation in average power $POUT_L(PIN)$ which can be derived at any point and which can be obtained by suitably selecting the matching circuits, for each amplifier, calculating, for each value of each setting parameter and for each input average power PIN value, a value of an optimisation criterion on the basis of the mathematical expectation, with the statistical distribution of the input signal, of at least one optimisation parameter from at least said ideal variation in average power $POUT_L(PIN)$, for each amplifier, selecting from each value of the optimisation criterion an optimum value of each setting parameter representing an optimisation of the optimisation criterion of the amplifier, and determining a corresponding average output power value of the amplifier, producing the amplification stage with a number N of amplifiers in parallel determined on the basis of an average output power value to be provided by the amplification stage and with, for each amplifier, matching circuits providing said optimum values of the setting parameters.

Thus, the use of the instantaneous power statistical distribution of the variable envelope input signal in a method in accordance with the invention allows the calculation of the value of an optimisation criterion and the selection of the setting parameters representing an optimisation of this optimisation criterion, whilst retaining a freedom of selection of a form of ideal variation in average power, a selection which can itself be effected in particular in accordance with at least one performance criterion of the amplification stage, e.g. a predetermined value of the signal/noise ratio and/or of the intermodulation rate.

The invention is thus based on a completely different approach to that of the prior art, using the predetermined instantaneous power statistical distribution of the variable envelope input signal in order to produce the matching circuits directly optimised for this distribution. Since the matching circuits were produced so as to provide said optimum values of the setting parameters, the amplification stage thus produced in accordance with the invention does not require a tracker for the envelope of the input signal nor a circuit allowing the dynamic real time adjustment of feed or biasing voltages.

In particular, in some embodiments in accordance with the invention, the optimisation criterion is selected from among the average output power POUTk of the amplifier (k being, throughout the text, a co-efficient associated, when necessary, with each amplifier k of the amplification stage); the consumption PDCk of the amplifier; the power DISSk dissipated by the amplifier; and an amplifier yield determined by the ratio between the average output power POUTk and the consumption PDCk; and combinations thereof. The optimum value of each setting parameter is thus selected so as to maximise the average output power POUTk, or minimise the consumption PDCk, or minimise the dissipated power DISSk, or maximise the yield.

Furthermore, in some advantageous embodiments in accordance with the invention, at least one optimisation parameter is selected from among the average output power POUTk of the amplifier and the consumption PDCk of the amplifier, each value of the optimisation criterion being calculated on the basis of the mathematical expectation, with the statistical distribution of the input signal, of this optimisation parameter from at least said ideal variation in average power $POUT_L(PIN)$. If the average output power POUTk is selected as the optimisation criterion, only this average output power can be used as the optimisation parameter, and only the mathematical expectation of the average output power can be calculated in accordance with the ideal variation in average power $POUT_L(PIN)$ with the statistical distribution of the input signal. If the consumption PDCk is selected as the optimisation criterion, only the consumption can be used as the optimisation parameter, and only the mathematical expectation of the consumption PDCk can be calculated, for which an ideal variation $PDC_L(PIN)$ can be determined from the ideal variation in average power $POUT_L(PIN)$. If the dissipated power is selected as the optimisation criterion, both the average output power POUTk and the consumption PDCk are used as optimisation parameters, for which the difference in the mathematical expectations is calculated. If the yield is selected as the optimisation criterion, both the average output power POUTk and the consumption PDCk are used as optimisation parameters, for which the ratio of the mathematical expectations is calculated.

In particular, in some embodiments, a method in accordance with the invention is also characterised in that at least one optimisation parameter is the consumption PDCk of the amplifier, and in that it further comprises the following steps:

characterising each amplifier, using a testbed measuring and recording, for each value of each setting parameter, characteristic variations on the basis of the average input power PIN, of the average power POUTcw(PIN) and of the consumption PDCcw(PIN) from a constant envelope signal applied to the input of the testbed, for each amplifier, calculating, for each value of each setting parameter, an ideal variation of the consumption $PDC_L(PIN)$ on the basis of the average input power PIN, from said ideal variation in average power $POUT_L(PIN)$ and said characteristic variations, and in that each value of the optimisation criterion is determined on the basis of the mathematical expectation, with the statistical distribution of the input signal, of the consumption $PDC_L(PIN)$ obtained from said ideal variation of the consumption $PDC_L(PIN)$ on the basis of the average input power PIN.

Furthermore, in some embodiments, the invention comprises a step of characterising each amplifier, using a testbed measuring and recording, for each value of each setting parameter, characteristic variations, on the basis of the average input power PIN, of the phase shift PMcw(PIN) of the amplifier from the constant envelope input signal and the matching circuits are selected to obtain a phase shift with a predetermined value, in particular zero.

Furthermore, in some embodiments in accordance with the invention, said form of ideal variation in average power $POUT_L(PIN)$ is an affine variation—in particular linear—to a greater start of saturation value. Advantageously, a linear variation having a predetermined performance at the point of saturation, e.g. a predetermined signal/noise ratio, e.g. of the order of 15 dB, or a predetermined intermodulation rate or the like, is selected in particular. It should be noted that this predetermined performance always remains the same regardless of the values of the setting parameters. Likewise, advantageously a linear variation having a curvature at the start of saturation is selected so as to be able to be derived at all points, including at the point of saturation.

Other forms of ideal variation in average output power can be selected. In particular, it is possible for provision to be made that this form of ideal variation has an increase greater than the affine variation of the power immediately prior to the start of saturation. In this regard, it suffices that this form of ideal variation can be derived at any point and can be obtained by suitable electronic circuits. The choice and configuration of the matching circuits allowing this ideal variation in average output power and/or in phase shift to be obtained can be effected in accordance with any otherwise known method, e.g. in accordance with French patent application FR1453773.

Furthermore, although the invention is applicable to any variable envelope input signal having a predetermined instantaneous power statistical distribution, it is advantageously applicable more particularly to an input signal—in particular a communication signal—comprising a modulation in accordance with a predetermined modulation scheme comprising one (or more) carrier(s). In these applications, advantageously and in accordance with the invention, the variable envelope input signal has an instantaneous power probability density of the input signal determined on the basis of the scheme of the modulation of the communication signal. In fact, it has been shown that any modulated signal has a probability density of the instantaneous power which is characteristic of the modulation scheme. Nevertheless, the invention is applicable more generally to any variable envelope input signal having an instantaneous power statistical distribution allowing the probability density of the instantaneous power to be determined and an mathematical expectation of the average power for this signal to be calculated. The inventor has thus shown that the statistical distribution of the input signal can be used to calculate the mathematical expectation of an optimisation parameter from the ideal variation in average power $POUT_L(PIN)$ of the amplified output signal and that, unexpectedly, this mathematical expectation is in fact very relevant for evaluating an optimisation criterion of the amplifier in a simple but very precise manner.

Furthermore, in some advantageous embodiments in accordance with the invention, said form of ideal variation in average power $POUT_L(PIN)$ is selected on the basis of a performance criterion of the amplification stage selected from among a signal/noise ratio value and an intermodulation rate. Other performance criteria can alternatively be used.

Advantageously, the invention is also applicable more particularly, but not exclusively, to a microwave frequency input signal, in particular a modulated input signal comprising one (or more) carrier(s) having a carrier frequency in a frequency band which can be selected in the microwave frequency range (300 MHz to 300 GHz) or outside of this range.

Furthermore, in some advantageous embodiments in accordance with the invention, at least one amplifier being a transistor, said setting parameters are selected from the group consisting of at least one biasing voltage and at least one load impedance characteristic. In the case of an amplifier formed by a field effect transistor, the setting parameters are the gate voltage, drain voltage, real portion of the load impedance and imaginary portion of the load impedance (or power factor $\varphi$).

As a variant or in combination, advantageously and in accordance with the invention, at least one amplifier being a travelling-wave tube, said setting parameters are selected from the group consisting of a beam current, helix voltage and collector voltage.

Furthermore, once the setting parameters of each amplifier have been determined in accordance with the optimisation criterion, the amplification stage can be produced with one (or more) amplifier(s) in parallel. In the case of a plurality of amplifiers in parallel, a plurality of identical amplifiers are advantageously used. However, there is nothing to prevent, in contrast, the use of different amplifiers as needed.

Advantageously in some embodiments in accordance with the invention, the amplification stage providing a predetermined average output power POUT, for each amplifier, an average output power value POUTk of the amplifier is determined for the optimum values of each setting parameter, and the number N of amplifiers in parallel of the amplification stage is selected such that:

$$\Sigma_1^{N-1} POUTk \leq POUT \leq \Sigma_1^N POUTk$$

The average output power POUTk of each amplifier is advantageously calculated from the mathematical expectation of the average output power of each amplifier calculated as previously indicated.

The invention relates to an amplification stage obtained a production method in accordance with the invention. It thus likewise relates to a stage for amplifying the power of a variable envelope input signal having a predetermined instantaneous power statistical distribution, this amplification stage comprising at least one amplifier and matching circuits determining setting parameters, the value of which influences average power POUT(PIN), phase PM(PIN), and consumption PDC(PIN) transfer functions of the amplification stage, characterised in that:

it comprises, for each amplifier, matching circuits providing optimum values of the setting parameters of the amplifier, these optimum values being determined from values of an optimisation criterion calculated for each value of each setting parameter, and so as to represent an optimisation of the optimisation criterion of the amplifier, the values of the optimisation criterion being calculated on the basis of the mathematical expectation, with the statistical distribution of the input signal, of at least one optimisation parameter from at least one ideal variation in average power $POUT_L(PIN)$ of the amplifier, it comprises a number N of amplifiers in parallel determined on the basis of an average output power value to be provided by the amplification stage.

An amplification stage in accordance with the invention can, in particular, have no tracker for the envelope of the input signal and no circuit allowing the biasing and feed voltages of the amplifier to be dynamically adjusted.

The invention also relates to a method for producing a stage for amplying the power of a variable envelope input signal, and such an amplification stage which are characterised in combination by all or some of the features mentioned above or below.

Figure 2:
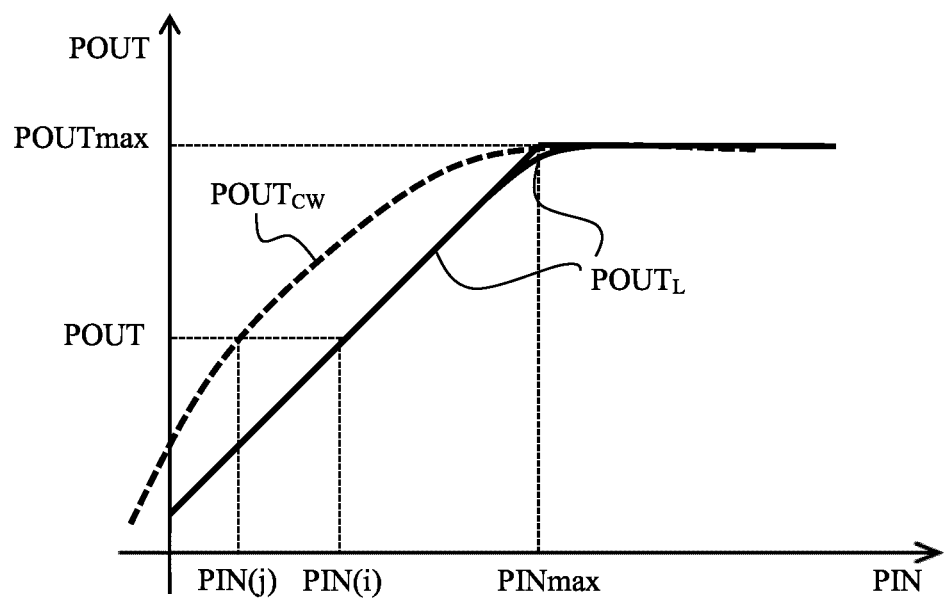
Figure 3:
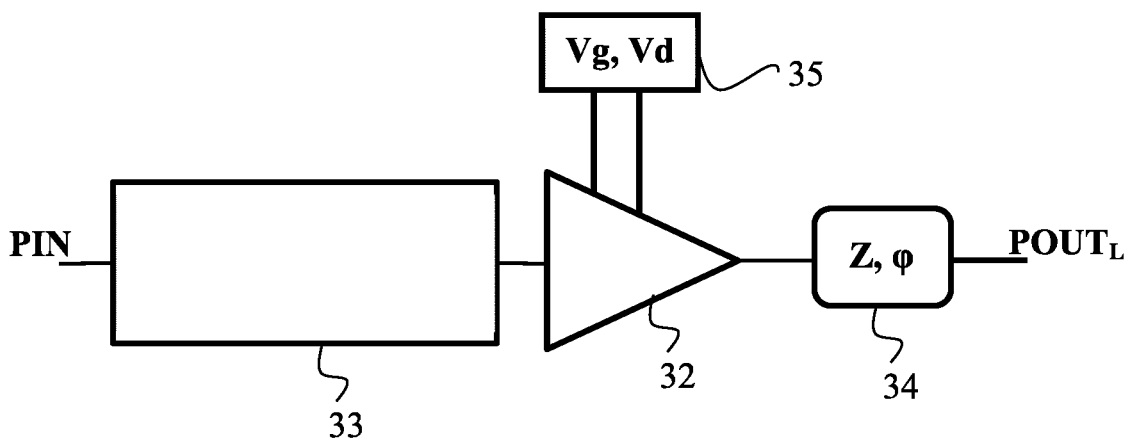
Figure 4A:
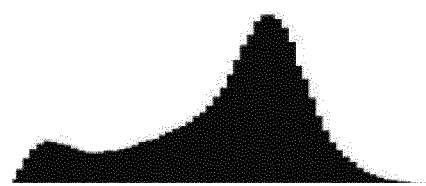
Figure 4B:
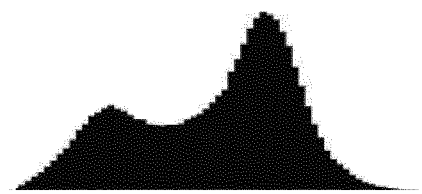
Figure 4C:
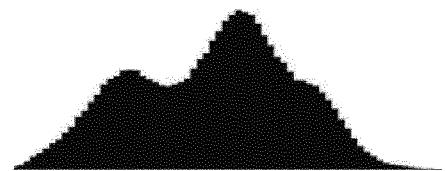
Figure 5:
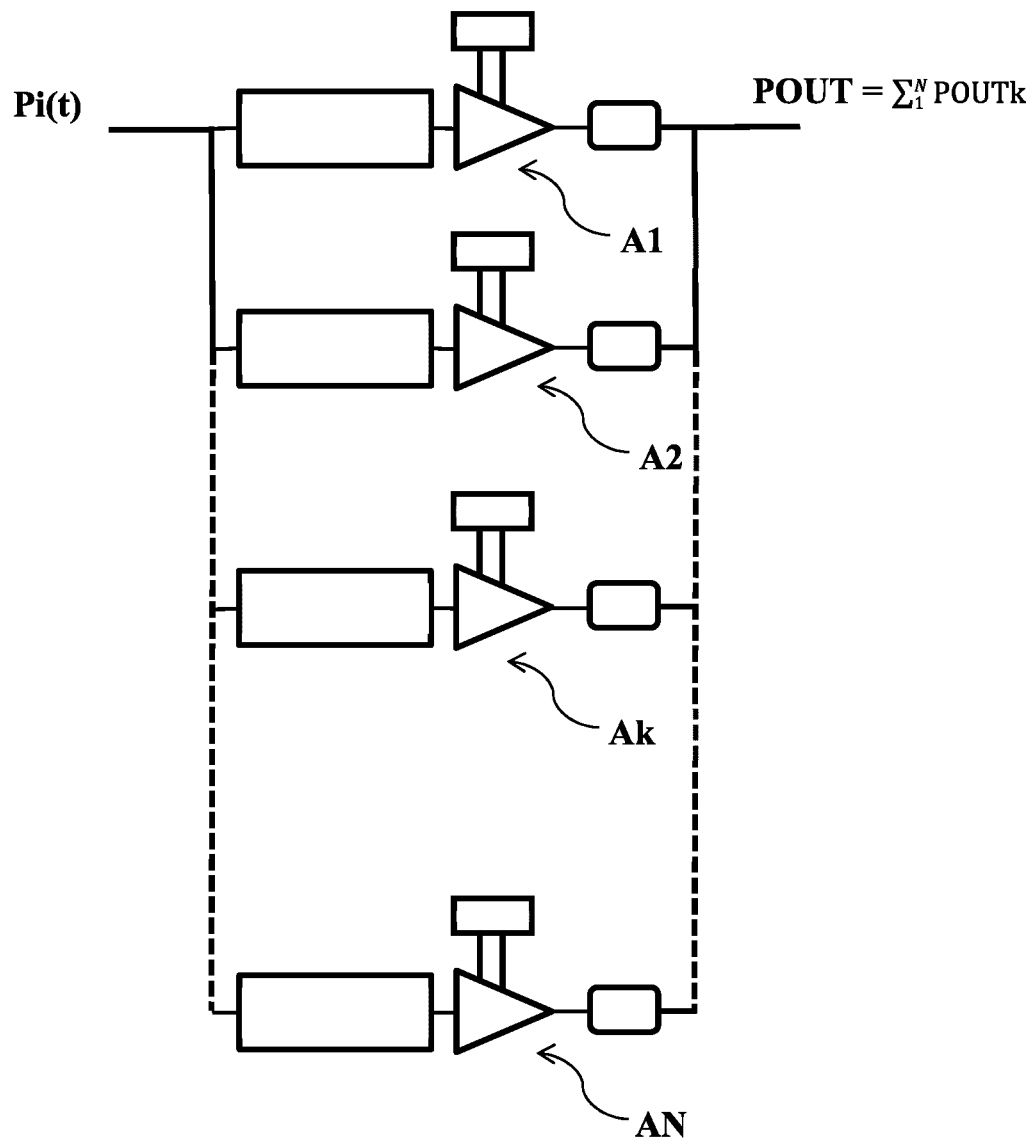

Other aims, features and advantages of the invention will become apparent upon reading the following description of a non-limiting exemplified embodiment of a method in accordance with the invention and with reference to the attached figures in which:

FIG. 1 is a logic diagram of the main steps of a method in accordance with one embodiment of the invention, FIG. 2 is a schematic diagram illustrating the average output power POUT variations on the basis of the average input power PIN of an amplifier, FIG. 3 is a diagram illustrating a matching linearization circuit associated with an amplifier for implementation of a method in accordance with the invention, FIGS. 4a to 4c are diagrams illustrating examples of statistical distribution (histograms of the numbers of occurrences of amplitude values) of signals in accordance with three modulation schemes, respective 7 APSK, 16 APSK and 16 QAM, FIG. 5 is a diagram illustrating an amplification stage in accordance with the invention produced by a method in accordance with the invention.

A method for producing an amplification stage shown in FIG. 1 comprises a first step 11 of characterising each amplifier 12 of the amplification stage. In this step 11, an amplifier 32 formed of a field effect transistor is placed in a testbed (not shown) of the type referred to as "load pull", for example as described by the publication "*Caractérisation en puissance aux fréquences millimétriques de circuits nano-métriques en technologie silicium*" M. de Matos, E. Kerhervé, H. Lapuyade, J-B. Bégueret, Y. Deval, 10èrnes journees pedagogiques CNFM (*CNFM 2008*), November 2008, St Malo, France. pp. 111-116. The drain Vd and gate Vg biasing voltage values and the actual value of the load impedance Z and its power factor φ are varied. Using this testbed, for each value of each of these setting parameters Vd, Vg, Z, φ, the characteristics of the variations of the average output power POUTcw(PIN) and of the consumption PDCcw(PIN) of the amplifier as a function of the average power PIN of a constant envelope input signal Scw are measured and recorded.

An example of a variation of the average power POUTcw (PIN) of the amplifier for a constant envelope input signal is shown in FIG. 2 by a curve of dashed lines. In practice, this variation can be recorded in the form of a table comprising a column of values of the average input power PIN, a column of measured values of the average output power POUTcw and a column of measured values of the consumption PDCcw.

Furthermore, in this characterising step 11, characteristic variations, on the basis of the average input power PIN, of the phase shift PMcw(PIN) of the amplifier from the constant envelope input signal are likewise measured and recorded in this same table with the testbed for each value of each setting parameter.

However, it is not possible to optimise the setting of the amplifier from measurements taken with a constant envelope input signal when this amplifier is intended to be used with a variable envelope input signal.

During the subsequent step 12, a linearization circuit 33 placed upstream of the amplifier 32 and able to provide a form of ideal variation in average output power $POUT_L$ (PIN) which can be derived at any point is selected. In the example in FIG. 2, this ideal variation $POUT_L$ is a variation comprising a first linear portion (affine in reality) to a maximum value POUTmax of saturation of the average output power of the amplifier, with a curved transition which can be derived at any point between the linear portion and the saturation portion. Other examples are possible, and there are numerous matching circuits which allow various forms of ideal variation in average output power of the amplifier to be obtained.

In particular, this linearization circuit 33 allowing an ideal variation in average output power to be obtained is selected on the basis of a performance criterion which it is desirable to impose on the amplifier, e.g. a value of the signal/noise ratio or of an intermodulation rate at the maximum saturation power, and which is known to be satisfactory for said ideal variation. Thus, in the example shown in FIG. 2, it is known in particular that it is possible to obtain a value of the signal/noise ratio at the saturation power which is e.g. equal to 15 dB by suitably selecting the linearization circuit 33. Therefore, by adopting this linearization circuit 33, it is ensured that the amplifier 32 will provide an output signal which will be in accordance with this performance criterion. Furthermore, the linearization circuit 33 is selected so as to obtain a phase shift of a predetermined value, preferably zero, in the amplified output signal.

A method for selecting such a linearization circuit 33 is described in French patent application FR1453773. Numerous other known linearization variants can be used in this regard. The characteristics of the electronic circuits allowing the selected variation form to be obtained can be determined in the case of a microwave frequency signal in particular as described by C. W. Park et al., "An Independently Controllable AM/AM and AM/PM Predistortion Linearizer for CDMA 2000 Multi-Carrier Applications", IEEE 2001. At lower frequencies, these characteristics can be determined from digital systems, such as equivalence tables (O. Hammi, S. Boumaiza, F. M. Ghannouchi, "On the Robustness of Digital Predistortion Function Synthesis and Average Power Tracking for Highly Nonlinear Power Amplifiers", IEEE transactions on microwave theory and techniques, vol. 55, no. 6, June 2007; Nagata Y., "Linear amplification technique for digital mobile communications", 39th IEEE Vehicular Technology Conference, May 1989, pp. 159-164; Faulkner M, Mattson T., Yates W., "Adaptive linearization using predistortion", 40th of the IEEE Vehicular Technology Conference, May 1990, pp. 35-40).

As a variant, a parameterizable linearizer circuit can likewise be used, such as the Lintech (US) linearizers in the WAFL series, compatible with the frequency range and average power range provided for the input signal, and for which the variations of the average power and phase shift transfer functions (or "profiles") which it produces are predetermined and known for different values of the adjustable parameters of this parameterizable linearizer circuit. A set of parameters of the linearizer circuit is selected such that the average power and phase shift transfer functions produced by this linearizer circuit correspond most closely to the sought-after ideal variation. The choice of a set of adjustable parameters of the linearizer circuit thus allows the selection of an ideal variation in average power $POUT_L$ (PIN) which can be derived at any point. In practice, this ideal variation in average outlet power $POUT_L(PIN)$ is represented by an additional column of the values of the average output power $POUT_L$ in accordance with this ideal variation in the table mentioned above.

Once the ideal variation in average power $POUT_L(PIN)$ has been selected, it is possible, if the consumption is selected as the optimisation parameter, to recalculate, for each value of each setting parameter, Vg, VD, Z, φ, an ideal variation of the consumption $PDC_L(PIN)$ on the basis of the average input power PIN, from said ideal variation in average power $POUT_L(PIN)$ and said measured variations POUTcw(PIN) and PDCcw(PIN). In fact, the above-mentioned table correlates the values of the measured consumption for the constant envelope signal PDCcw on the basis of the values of the measured output power for the constant envelope signal POUTcw.

For example, the above-mentioned table is the following:

| Line i, j | PIN | $POUT_{cw}$ | $PDC_{cw}$ | $POUT_L$ | $PDC_L$ |
|---|---|---|---|---|---|
| 1 | 0 | 3 | 2 | 2 | 1 |
| 2 | 2 | 8 | 6 | 5 | 4 |
| 3 | 4 | 12 | 10 | 7 | 6 |
| 4 | 6 | 16 | 13 | 10 | 8 |
| 5 | 8 | 19 | 16 | 12 | 10 |
| 6 | 10 | 22 | 18 | 15 | 13 |
| 7 | 12 | 24 | 19 | 18 | 14 |
| 8 | 14 | 25 | 20 | 20 | 16 |
| 9 | 16 | 26 | 20 | 23 | 16 |
| 10 | 18 | 26 | 20 | 25 | 20 |
| 11 | 20 | 26 | 20 | 26 | 20 |

In order to calculate $PDC_L(i)$ at line i, the following linear interpolation formula is used for example:

$PDC_L(i)=POUT_L(i)\times[POUTcw(j)-POUTcw(j-1)]/[PDCcw(j)-PDCcw(j-1)]$ with j being the selected line such that:

$POUTcw(j) \geq POUT_L(i) \geq POUTcw(j-1)$

Other forms of interpolation can be selected.

If the measured values and those representative of the ideal variation are sufficient in number, there will exist, as shown in FIG. 2, a value of j for which:

$POUTcw(PIN(j))=POUT_L(PIN(i))$, and $PDC_L(PIN(i))$ could be taken to equal PDCcw(PIN(j)).

Then (step 13, FIG. 1), the instantaneous power statistical distribution of the variable envelope input signal to be amplified, which is predetermined, in particular in accordance with the modulation scheme, is used to calculate an optimisation criterion during step 14.

In fact, it proves to be the case that the signals, such as the communication signals, modulated on one (or more) carrier(s) have an instantaneous power statistical distribution which depends only on the modulation scheme. FIG. 4a thus illustrates the form of histograms of numbers of occurrences of amplitude values of signals modulated in accordance with a 7APSK modulation (modulation of amplitude and phase with 7 symbols); FIG. 4b illustrates the form of histograms of the numbers of occurrences of amplitude values of signals modulated in accordance with a 16APSK modulation (modulation of amplitude and phase with 16 symbols); FIG. 4c illustrates the form of histograms of the numbers of occurrences of amplitude values of signals modulated in accordance with a 16QAM modulation (quadrature modulation of amplitude with 16 symbols). If the modulation scheme, or more generally the instantaneous power statistical distribution of a signal, is known the probability density $D_{Se}$ (Pi) of the average power of the signal Se on the basis of each value of instantaneous power Pi of the signal Se is known. In practice, this statistical distribution can be in the form of a table of discrete values from which numerical calculations are performed, or of an analytical function or an analytical, e.g. polynomial, approximation of the probability density. Therefore, the mathematical expectation of the average power of such a signal Se can be calculated (by numerical calculation over discrete values or with an analytical function).

In accordance with the invention, the probability density $D_{Se}(Pi)$ of the average power of the variable envelope input signal Se to be amplified on the basis of each value of instantaneous power Pi of this variable envelope input signal Se to be amplified is used to calculate, in step 14, the mathematical expectation of at least one optimisation parameter linked with the average power of the amplified output signal, from at least said ideal variation in average power $POUT_L(PIN)$. Advantageously, at least one such optimisation parameter is selected from among the average output power POUTk of the amplifier and the consumption PDCk of the amplifier.

The choice of each optimisation parameter depends upon the optimisation criterion of the amplifier which it is desired to retain, which itself depends on the application of the amplification stage to be produced.

For example, in particular for space applications, an electric yield determined by the ratio between the average output power POUTk and the consumption PDCk is preferably used as the optimisation criterion. In this case, the average output power POUTk and the consumption PDCk of the amplifier are thus used as the optimisation parameter. Therefore, in step 14, for each value of each setting parameter Vd, Vg, Z, φ, the mathematical expectation of these optimisation parameters is calculated according to the following formulae:

$E_{POUT_L}[Pi]=\int_0^\infty P_{OUT_L}(Pi)\cdot D_{Se}(Pi)\cdot dPi$ $E_{PDC_L}[Pi]=\int_0^\infty PDC_L(Pi)\cdot D_{Se}(Pi)\cdot dPi$ And the yield η:

$$\eta = \frac{E_{POUT_L}[Pi]}{E_{PDC_L}[Pi]}$$

In practice, these formulae are implemented by statistical formula applications in the tables of values giving $D_{Se}(Pi)$ and $P_{OUT_L}(Pi)$ using a spreadsheet. As a variant, a calculation can be made at least for the analytical portion, from an analytical function (or an analytical approximation) of the probability density $D_{S_e}(Pi)$ and an analytical, e.g. polynomial, approximation of $P_{OUT_L}(Pi)$.

As a variant, an optimisation criterion other than the yield can be used. For example, only the value of the average output power POUTk can be used as the optimisation criterion, in which case in step 14 only the mathematical expectation of the average output power $E_{POUT_L}[Pi]$ is calculated. If only the consumption PDCk is used as the optimisation criterion, in step 14 only the mathematical expectation of the consumption $E_{PDC_L}[Pi]$ is calculated. If only the dissipated power DISSk is used as the optimisation criterion, in step 14 only the mathematical expectation of the dissipated power is calculated:

$$E_{DISS_L}[Pi] = E_{PDC_L}[Pi] - E_{POUT_L}[Pi]$$

It should be noted that each mathematical expectation is calculated from the ideal variation of the corresponding optimisation parameter, i.e. at least from the ideal variation in average power $POUT_L(PIN)$. By thus using an amplifier 32 corrected by matching circuits 33, 34 and 35, such an ideal variation can in fact be used to calculate each mathematical expectation used to calculate an optimisation criterion, whilst ensuring that the amplifier will satisfy predetermined performance criteria linked with the previously made choice of this ideal variation. For example, by using a linearized ideal variation as indicated above, it can be ensured that the amplifier will provide a predetermined signal/noise ratio or intermodulation rate for any value of its average output power.

At the end of step 14, the different calculations of the optimisation criterion for each value of each setting parameter Vd, Vg, Z, φ are recorded in a table.

In the subsequent step 15, an optimum combination of the values of setting parameters Vd, Vg, Z, φ is determined from the table of calculated values of the optimisation criterion, in order to optimise this optimisation criterion of the amplifier. Therefore, the optimum combination which provides the highest numerical value $\eta_{max}$ of the yield η or that which provides the highest numerical value Max[POUTk] of the average output power POUTk or that which provides the lowest numerical value Min[PDCk] of the consumption PDCk is determined e.g. in the table.

A precise and complete optimisation of the setting of the amplifier is obtained in a simple manner, taking into account the different setting parameters and performance criteria of the amplifier, regardless of what this optimisation criterion is and regardless of what the technology of the amplifier and the corresponding setting parameters are.

Therefore, such an optimum combination of values of setting parameters of an amplifier can be determined according to the method in accordance with the invention not only for amplifiers formed of field effect transistors (solid-state circuits) but also for travelling-wave tubes, the setting parameters thus typically being the beam current Ik dictated by the voltage $VA_0$, the helix voltage Vh and the collector voltages Vc1,2,3,4. Steps 11 to 15 can in fact be implemented with these setting parameters.

Similarly, there is nothing to prevent the selection of any other form of ideal variation than that shown in FIG. 2, in accordance with the required performance criteria. For example, it is possible to provide an over-power zone at the apex of the linearized portion of the ideal variation to increase the average output power close to saturation to a greater extent than this linearized variation. That being said, it is appropriate to select an ideal variation which, on the one hand, can be effected by electronic matching circuits and, on the other hand, corresponds to a physical reality, i.e. does not have any discontinuity and can be derived at any point.

Once the optimum combination of the setting parameters of each amplifier k has been determined, the value of the average output power POUTk=$E_{POUT_L}[Pi]$ of the amplifier corresponding to this optimum combination is known, and in step 16 the number N of amplifiers A1, A2, . . . Ak, . . . , AN, to be used in the amplification stage is determined such that the average output power POUT of the amplification stage can be obtained by placing a plurality of amplifiers A1, A2, . . . Ak, . . . , AN in parallel, as shown in FIG. 5, if necessary.

The number N of amplifiers A1, A2, . . . Ak, . . . , AN in parallel is determined such that:

$$\Sigma_1^{N-1} POUTk \leq POUT \leq \Sigma_1^N POUTk$$

Preferably, when a plurality of amplifiers in parallel are used to produce the amplification stage, all the amplifiers are identical. However, there is nothing to prevent the use of different amplifiers, but this requires the steps of optimising the setting parameters to be repeated for each amplifier.

Therefore, in a method in accordance with the invention, given an average output power POUT, at least one performance criterion (e.g. a signal/noise ratio and/or an intermodulation rate), and an instantaneous power statistical distribution, an optimum combination of the setting parameters of each amplifier k, a corresponding value of average output power POUTk=$E_{POUT_L}[Pi]$ of each amplifier and a number N of amplifiers to be used are determined so as to obtain the average output power POUT of the amplification stage. It should be noted in this regard that the average power of the input signal is not a given constraint but is determined to correspond to the optimum combination of the setting parameters of each amplifier and to the corresponding average output power POUTk.

As shown in FIG. 3, when field effect transistors are used as amplifiers, the amplification stage comprises, for each amplifier 32, an upstream linearization circuit 33 (allowing in particular an ideal variation of the average output power of the amplifier to be obtained), an output load impedance 34 and a biasing device 35 providing the biasing voltages Vg, Vd of the transistor 32. The linearization circuit 33, the output load impedance 34 and the biasing device 35 are matching circuits of the amplification stage. These matching circuits 33, 34, 35 have fixed characteristics corresponding to the optimum values of the setting parameters and do not depend in particular dynamically on the characteristics of the input signal. Of course, if the amplification stage comprises a plurality of such identical amplifiers 32, it is possible to use a single linearization circuit 33 common to the various amplifiers 32, a single output circuit forming the load impedance 34 for all of the amplifiers 32 and a single biasing circuit 35 providing the various biasing voltages to the various transistors in parallel.

It should be noted that in a method in accordance with the invention, the optimisation of the setting parameters of each amplifier if favoured over the number of amplifiers possibly used in parallel and over the value of the average output power or that of the average input power. In fact, the inventor was able to show, contrary to the generally accepted principles in this regard according to which it is sufficient to minimise the number of integrated power amplifiers, that it proves to be case that such an optimisation allows in practice an increase in performance such that it largely compensates for the increased cost and/or increased weight possibly brought about by the use of a plurality of amplifiers in parallel, including in applications for on-board systems, in particular for space systems.

The invention provides a method which is particular simple, sound, reliable and universal for determining the optimum setting parameters of a stage for amplifying the power of variable envelope signals, and in particular communication signals, in particular modulated signals. It goes without saying that the invention can cover numerous variants and applications other than those described above and illustrated in the figures.

The invention claimed is:

1. A method for producing a stage for amplifying the power of a variable envelope input signal having a predetermined instantaneous power statistical distribution, this amplification stage comprising at least one amplifier and matching circuits determining setting parameters, the value of which influences average power POUT(PIN), phase PM(PIN), and consumption PDC(PIN) transfer functions of the amplification stage, the method comprising:
for each amplifier, selecting a form of ideal variation in average power $POUT_L(PIN)$ which can be derived at any point and which can be obtained by suitably selecting the matching circuits,
for each amplifier, calculating, for each value of each setting parameter and for each input average power PIN value, a value of an optimization criterion on the basis of the mathematical expectation of at least one optimization parameter associated with the consumption of the amplifier, this mathematical expectation being calculated with said instantaneous power statistical distribution of the input signal and from at least said ideal variation in average power $POUT_L(PIN)$,
for each amplifier, selecting from each value of the optimization criterion an optimum value of each setting parameter representing an optimization of the optimization criterion of the amplifier, and determining a corresponding average output power value of the amplifier,
producing the amplification stage with a number N of amplifiers in parallel determined on the basis of an average output power value to be provided by the amplification stage and with, for each amplifier, matching circuits providing said optimum values of the setting parameters,
wherein the step of calculating the optimization criterion comprises:
characterizing each amplifier, using a testbed measuring and recording, for each value of each setting parameter, characteristic variations on the basis of the average input power PIN, of the average power POUTcw(PIN) and of the consumption PDCcw(PIN) from a constant envelope signal applied to the input of the testbed, and
for each amplifier, calculating, for each value of each setting parameter, an ideal variation of the consumption PDCL(PIN) on the basis of the average input power PIN, from said ideal variation in average power POUTL(PIN) and said characteristic variations, and in that each value of the optimization criterion is determined on the basis of the mathematical expectation, with the statistical distribution of the input signal, of the consumption PDCL(PIN) obtained from said ideal variation of the consumption PDCL(PIN) on the basis of the average input power PIN.

2. The method according to claim 1, wherein the optimization criterion is selected from among the average output power POUTk of the amplifier; the consumption PDCk of the amplifier; the power dissipated by the amplifier; and an amplifier yield determined by the ratio between the average output power POUTk and the consumption PDCk; and combinations thereof.

3. The method according to claim 1, wherein at least one optimization parameter is selected from among the average output power POUTk of the amplifier and the consumption PDCk of the amplifier, each value of the optimization criterion being calculated on the basis of the mathematical expectation, with the statistical distribution of the input signal, of this optimization parameter from at least said ideal variation in average power $POUT_L(PIN)$.

4. The method according to claim 1, wherein at least one optimization parameter is the consumption PDCk of the amplifier, the method further comprising:
characterizing each amplifier, using a testbed measuring and recording, for each value of each setting parameter, characteristic variations on the basis of the average input power PIN, of the average power POUTcw(PIN) and of the consumption PDCcw(PIN) from a constant envelope signal applied to the input of the testbed,
for each amplifier, calculating, for each value of each setting parameter, an ideal variation of the consumption $PDC_L(PIN)$ on the basis of the average input power PIN, from said ideal variation in average power $POUT_L$ (PIN) and said characteristic variations,
and wherein each value of the optimization criterion is determined on the basis of the mathematical expectation, with the statistical distribution of the input signal, of the consumption $PDC_L(PIN)$ obtained from said ideal variation of the consumption $PDC_L(PIN)$ on the basis of the average input power PIN.

5. The method according to claim 4, further comprising a step of characterizing each amplifier, using a testbed measuring and recording, for each value of each setting parameter, characteristic variations, on the basis of the average input power PIN, of the phase shift PMcw(PIN) of the amplifier from the constant envelope input signal, wherein the matching circuits are selected to obtain a phase shift with a predetermined value, in particular zero.

6. The method according to claim 1, wherein said form of ideal variation in average power $POUT_L(PIN)$ is an affine variation to a greater start of saturation value.

7. The method according to claim 1, wherein the input signal comprises a modulation in accordance with a predetermined modulation scheme.

8. The method according to claim 7, wherein the variable envelope input signal has an instantaneous power probability density of the input signal determined on the basis of the scheme of the modulation of the communication signal.

9. The method according to claim 1, wherein said form of ideal variation in average power $POUT_L(PIN)$ is selected on the basis of a performance criterion of the amplification stage selected from among a signal/noise ratio value and an intermodulation rate.

10. The method according to claim 1, wherein the input signal is a microwave frequency signal.

11. The method according to claim 1, wherein at least one amplifier being a transistor, said setting parameters are selected from the group consisting of at least one biasing voltage and at least one load impedance characteristic.

12. The method according to claim 1, wherein at least one amplifier being a travelling-wave tube, said setting parameters are selected from the group consisting of a beam current, helix voltage and collector voltage.

13. The method according to claim 1, wherein the amplification stage providing a predetermined average output power POUT, for each amplifier, an average output power value POUTk of the amplifier is determined for the optimum values of each setting parameter, and wherein the number N of amplifiers in parallel of the amplification stage is selected such that:

$$\Sigma_1^{N-1} POUTk \leq POUT \leq \Sigma_1^N POUTk.$$

14. The method according to claim 1, wherein the amplification stage is produced with a plurality of identical amplifiers.

15. The method according to claim 2, wherein at least one optimization parameter is selected from among the average output power POUTk of the amplifier and the consumption PDCk of the amplifier, each value of the optimization criterion being calculated on the basis of the mathematical expectation, with the statistical distribution of the input signal, of this optimization parameter from at least said ideal variation in average power POUTL(PIN).

16. The method according to claim 2, wherein at least one optimization parameter is the consumption PDCk of the amplifier, the method further comprising:
characterizing each amplifier, using a testbed measuring and recording, for each value of each setting parameter, characteristic variations on the basis of the average input power PIN, of the average power POUTcw(PIN) and of the consumption PDCcw(PIN) from a constant envelope signal applied to the input of the testbed,
for each amplifier, calculating, for each value of each setting parameter, an ideal variation of the consumption PDCL(PIN) on the basis of the average input power PIN, from said ideal variation in average power POUTL(PIN) and said characteristic variations,
and wherein each value of the optimization criterion is determined on the basis of the mathematical expectation, with the statistical distribution of the input signal, of the consumption PDCL(PIN) obtained from said ideal variation of the consumption PDCL(PIN) on the basis of the average input power PIN.

17. The method according to claim 3, wherein at least one optimization parameter is the consumption PDCk of the amplifier, the method further comprising:
characterizing each amplifier, using a testbed measuring and recording, for each value of each setting parameter, characteristic variations on the basis of the average input power PIN, of the average power POUTcw(PIN) and of the consumption PDCcw(PIN) from a constant envelope signal applied to the input of the testbed,
for each amplifier, calculating, for each value of each setting parameter, an ideal variation of the consumption PDCL(PIN) on the basis of the average input power PIN, from said ideal variation in average power POUTL(PIN) and said characteristic variations,
and wherein each value of the optimization criterion is determined on the basis of the mathematical expectation, with the statistical distribution of the input signal, of the consumption $PDC_L(PIN)$ obtained from said ideal variation of the consumption $PDC_L(PIN)$ on the basis of the average input power PIN.

18. The method according to claim 1, wherein said form of ideal variation in average power $POUT_L(PIN)$ is an affine variation to a greater start of saturation value.

19. The method according to claim 2, wherein said form of ideal variation in average power $POUT_L(PIN)$ is an affine variation to a greater start of saturation value.

20. An amplification stage for amplifying the power of a variable envelope input signal having a predetermined instantaneous power statistical distribution, the amplification stage comprising at least one amplifier and matching circuits determining setting parameters, the value of which influences average power POUT(PIN), phase PM(PIN), and consumption PDC(PIN) transfer functions of the amplification stage,
wherein:
the amplification stage comprises, for each amplifier, matching circuits providing optimum values of the setting parameters of the amplifier,
the optimum values being determined from values of an optimization criterion calculated for each value of each setting parameter, and so as to represent an optimization of the optimization criterion of the amplifier,
the values of the optimization criterion being calculated on the basis of the mathematical expectation of at least one optimization parameter associated with the consumption of the amplifier, the mathematical expectation being calculated with said instantaneous power statistical distribution of the input signal and from at least one ideal variation in average power $POUT_L(PIN)$ of the amplifier, and
the amplification stage comprises a plurality of amplifiers in parallel, a number N of amplifiers in parallel is determined on the basis of an average output power value to be provided by the amplification stage such that:
$\Sigma_1^{N-1} POUTk \leq POUT \leq \Sigma_1^N POUTk$, wherein calculating the optimization criterion comprises:
characterizing each amplifier, using a testbed measuring and recording, for each value of each setting parameter, characteristic variations on the basis of an average input power PIN, of an average power POUTcw(PIN) and of a consumption PDCcw(PIN) from a constant envelope signal applied to the input of the testbed, and
for each amplifier, calculating, for each value of each setting parameter, an ideal variation of the consumption PDCL(PIN) on the basis of the average input power PIN, from said ideal variation in average power POUTL(PIN) and said characteristic variations, and in that each value of the optimization criterion is determined on the basis of the mathematical expectation, with the statistical distribution of the input signal, of the consumption PDCL(PIN) obtained from said ideal variation of the consumption PDCL(PIN) on the basis of the average input power PIN.

* * * * *